(12) United States Patent
Park et al.

(10) Patent No.: US 7,573,123 B2
(45) Date of Patent: Aug. 11, 2009

(54) SEMICONDUCTOR DEVICE AND METHOD FOR FORMING THE SAME

(75) Inventors: Young-Soo Park, Gyeonggi-do (KR); Kyoo-Chul Cho, Gyeonggi-do (KR); Hee-Sung Kim, Seoul (KR); Tae-Soo Kang, Gyeonggi-do (KR); Sam-Jong Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/775,130

(22) Filed: Jul. 9, 2007

(65) Prior Publication Data

US 2008/0014722 A1    Jan. 17, 2008

(30) Foreign Application Priority Data

Jul. 10, 2006    (KR) ...................... 10-2006-0064520

(51) Int. Cl.
*H01L 29/04* (2006.01)
*H01L 31/036* (2006.01)

(52) U.S. Cl. ....................... 257/628; 257/347; 257/627; 257/E21.32; 257/E21.051; 257/E21.229; 257/E21.571; 257/E21.014

(58) Field of Classification Search ................ 438/628, 438/627, 347, 401, 192, 288, 350
See application file for complete search history.

(56) References Cited

U.S. PATENT DOCUMENTS 7,098,477 B2 *   8/2006   Zhu et al. ...................... 257/66
7,148,541 B2 *   12/2006  Park et al. ..................... 257/347
2004/0256700 A1 * 12/2004  Doris et al. .................. 257/627

FOREIGN PATENT DOCUMENTS

KR   2000-0003945   1/2000
KR   10-2005-0006836   1/2005

OTHER PUBLICATIONS

English language abstract of Korean Publication No. 2000-0003945.
English language abstract of Korean Publication No. 10-2005-0006836.

* cited by examiner

*Primary Examiner*—David Nhu
(74) *Attorney, Agent, or Firm*—Marger Johnson & McCollom, P.C.

(57) ABSTRACT

Provided are a semiconductor device, and a method of forming the same. In one embodiment, the semiconductor device includes a semiconductor layer, first and second semiconductor fins, an insulating layer, and an inter-fin connection member. The first and second semiconductor fins are placed on the semiconductor layer, and have different crystal directions. The first semiconductor fin is connected to the semiconductor layer, and has the equivalent crystal direction as that of the semiconductor layer. The insulating layer is interposed between the second semiconductor fin and the semiconductor layer, and has an opening in which the first semiconductor fin is inserted. The inter-fin connection member connects the first semiconductor fin and the second semiconductor fin together on the insulating layer.

9 Claims, 7 Drawing Sheets

SEMICONDUCTOR DEVICE AND METHOD FOR FORMING THE SAME

CROSS-REFERENCE TO RELATED APPLICATIONS

This U.S. non-provisional patent application claims priority under 35 U.S.C. § 119 to Korean Patent Application No. 2006-64520, filed on Jul. 10, 2006, the entire contents of which are hereby incorporated by reference.

BACKGROUND

1. Technical Field

The present invention disclosed herein relates to a semiconductor device, and more particularly, to a semiconductor device using a silicon-on-insulator (SOI) substrate, and a method of forming the same.

2. Description of the Related Art

SOI technology effectively isolates semiconductor devices formed on a top layer of a silicon substrate from the bulk silicon substrate, and thereby the semiconductor devices have stable electrical characteristics at a high supply voltage compared to a general junction isolation technology. A device formed on an SOI substrate requires a smaller number of processes than a device formed on a bulk silicon substrate. Also, the SOI technology reduces capacitive coupling occurring between devices formed in a semiconductor chip. In general, the SOI substrate includes a buried oxide layer between an upper SOI silicon layer on which a semiconductor device is formed, and a lower bulk silicon substrate. Since the buried oxide layer has low thermal conductivity, the efficiency of heat release is reduced, and thus the device temperature is increased during operation. As the device temperature is increased, operational characteristics of the device may be deteriorated.

A semiconductor device may include both an NMOS transistor and a PMOS transistor. The NMOS transistor includes source/drain regions formed by implanting n-type impurities, and the PMOS transistor includes source/drain regions formed by implanting p-type impurities. In the NMOS transistor, electrons work as a carrier moving through a channel region. In the PMOS transistor, holes work as a carrier moving through a channel region. Because the mobility of electrons and holes varies according to a crystal direction of single crystal silicon, it is difficult to form optimized NMOS and PMOS transistors on the same silicon substrate at the same time. The present invention addresses these and other disadvantages of the conventional art.

SUMMARY

Embodiments of the present invention provide a semiconductor device including an SOI substrate having a structure that can release heat generated by device operations, and a method of forming the same. Embodiments of the present invention also provide a semiconductor device including optimized NMOS and PMOS transistors, and a method of forming the same.

According to some embodiments of the present invention, the semiconductor device comprises a semiconductor layer; a first semiconductor fin and a second semiconductor fin placed on the semiconductor layer and having different crystal directions or crystal orientations; an insulating layer interposed between the second semiconductor fin and the semiconductor layer and having an opening in which the first semiconductor fin is inserted; and an inter-fin connection member connecting the first semiconductor fin and the second semiconductor fin to each other on the insulating layer. The first semiconductor fin is connected to the semiconductor layer, and has the equivalent crystal direction as that of the semiconductor layer.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
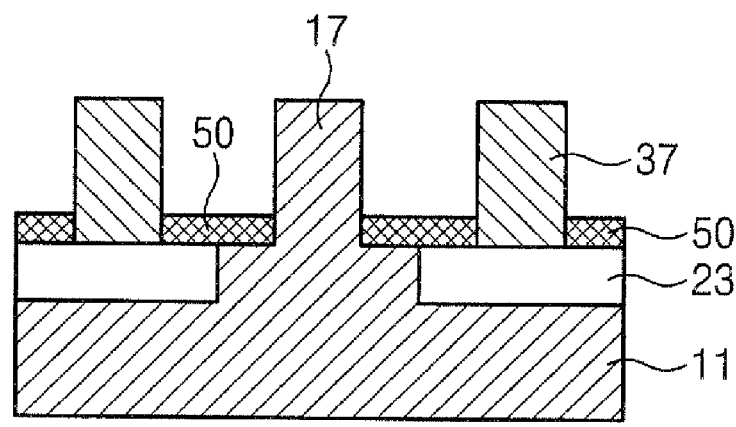
FIG. 1 is a cross-sectional view of a semiconductor device according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms first and second are used herein to describe various elements such as a semiconductor substrate, a semiconductor layer, an epitaxial layer, and a semiconductor fin, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration.

Hereinafter, an exemplary embodiment of the present invention will be described in conjunction with the accompanying drawings.

In the present disclosure, the terms 'crystal plane' and 'crystal direction' are used. In crystallography, a notation for representing the crystal plane or the crystal direction uses a set of three or more integers indicating a plane location or a vector direction in a lattice. The set of integers indicating a plane in a crystal lattice is determined as follows.

First, intersections of the plane and three crystal axes are determined, and those intersections are expressed by multiples of unit vectors. Here, the plane may be moved to reach each crystal axis, with its orientation fixed. The reciprocals of the intersections are taken, and converted into the lowest set of integers h, k, and l. The set of integers h, k, and l is enclosed in parentheses as (hkl).

The set of integers h, k, and l is the Miller index. The set of integers defines parallel planes in the lattice. From the crystallographic viewpoint, many planes in the lattice are equivalent. That is, a plane having the given Miller index may be moved within the lattice by just choosing a location and orientation of a unit cell. Planes with the same relative symmetry are considered equivalent from the crystallographic viewpoint. Those crystallographically equivalent planes are expressed using { } instead of ( ), and are sometimes referred to as a family of crystallographic planes. Thus, the crystallographic plane family {100} includes three equivalent planes (100), (010), and (001).

A direction in the lattice is expressed by a set of three integers having the same relation with vector components in the direction. The three vector components are described as multiples of the unit vector, and these numbers are reduced to the lowest set of integers and enclosed in brackets [ ]. Like the planes, many directions in the lattice are equivalent, and enclosed in brackets < >. For example, the direction <100> crystallographically includes three equivalent directions [100], [010], and [001]. One of ordinary skill in the art would appreciate that the direction [100] is normal to the plane (100). According to one aspect of the invention, when two materials, such as two semiconductor substrates or two semiconductor layers, have different crystal planes with respect to each other, the two materials may be referred to as having different crystal orientations.

In embodiments of the present invention, silicon is used as a semiconductor material, but is merely an example. Therefore, other semiconductor materials besides silicon may be used. That is, a silicon substrate, a silicon layer, and a silicon fin are merely examples of a semiconductor substrate, a semiconductor layer, and a semiconductor fin, respectively.

Structure of the Semiconductor Device

FIG. 1 is a schematic cross-sectional view of a semiconductor device according to an embodiment of the present invention. Referring to FIG. 1, a first silicon fin 17 and a second silicon fin 37 are disposed on a silicon layer 11. The first silicon fin 17 may be one that is epitaxially grown from the silicon layer 11. Top surfaces of the first silicon fin 17 and the silicon layer 11 may have the equivalent crystal plane and the equivalent crystal direction. For example, the top surfaces of the first silicon fin 17 and the silicon layer 11 may have the crystal plane {100} and the crystal direction <110>, or the crystal plane {110} and the crystal direction <100>. Insulating layers 23 are interposed between the second silicon fins 37 and the silicon layer 11. The insulating layers 23 may be, for example, a silicon oxide layer. An inter-fin connection member 50 is provided on the insulating layers 23 between the first silicon fin 17 and the second silicon fin 37. The inter-fin connection member 50 connects lower portions of the first and second silicon fins 17 and 37, and may include materials with the equivalent crystal plane and the equivalent crystal direction with those of the first silicon fin 17 and the second silicon fin 37.

Top surfaces of the first silicon fin 17 and the second silicon fin 37 may have the equivalent crystal plane but may be arranged to have different crystal directions. For example, the top surface of the first silicon fin 17 may have the crystal direction <110>, and the top surface of the second silicon fin 37 may have the crystal direction <100>. In silicon, the mobility of holes is greater in the crystal direction <100> than in the crystal direction <110>, and mobility of electrons is greater in the crystal direction <110> than in the crystal direction <100>. Therefore, an NMOS transistor (not shown) may be provided at a silicon fin with a top surface having the crystal direction <110>, and a PMOS transistor (not shown) may be provided in a silicon fin with a top surface having the crystal direction <100>. Thus, operational characteristics of the NMOS and PMOS transistors can be improved.

The top surfaces of the first silicon fin 17 and the second silicon fin 37 may have different crystal planes. For example, the top surface of the first silicon fin 17 may have the crystal plane {100}, and the top surface of the second silicon fin 37 may have the crystal plane {110}.

The inter-fin connection member 50 serves to release heat generated from the second silicon fin 37 to the silicon layer 11 connected to the first silicon fin 17. Thus, an increase in device temperature (especially, a device placed at the semiconductor fin 37) can be prevented. Therefore, operational characteristics of the device can be improved.

Figure 2:
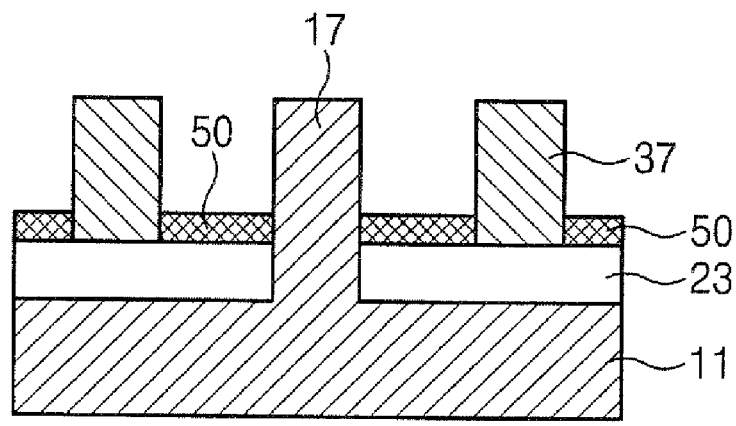
FIG. 2 is a cross-sectional view of a semiconductor device according to another embodiment of the present invention.

FIG. 2 is a schematic cross-sectional view of a semiconductor device according to another embodiment of the present invention. In the following discussion of the embodiment of FIG. 2, description of the common parts to the above-mentioned embodiment will be omitted, and only differences will be described. In the embodiment shown in FIG. 1, an interval between the insulating layers 23 is greater than a width of the first semiconductor fin 17. By comparison, in the present embodiment, an interval between the insulating layers 23 is substantially the same as a width of the first semiconductor fin 17. That is, the interval between the insulating layers 23 may vary even if the widths of the first and second silicon fins 17 and 37 are fixed. This means that the width of each insulating layer 23 can vary, and the width of the insulating layer 23 may be equal to or greater than the width of the second silicon fin 37. The interval between the insulating layers 23 may be determined by considerations of electrical characteristics, a design rule (degree of integration), and available manufacturing processes for a required semiconductor device.

Method of Forming a Semiconductor Device

FIGS. 3 through 11 are cross-sectional views illustrating a method of forming a semiconductor device according to an embodiment of the present invention.

Figure 3:
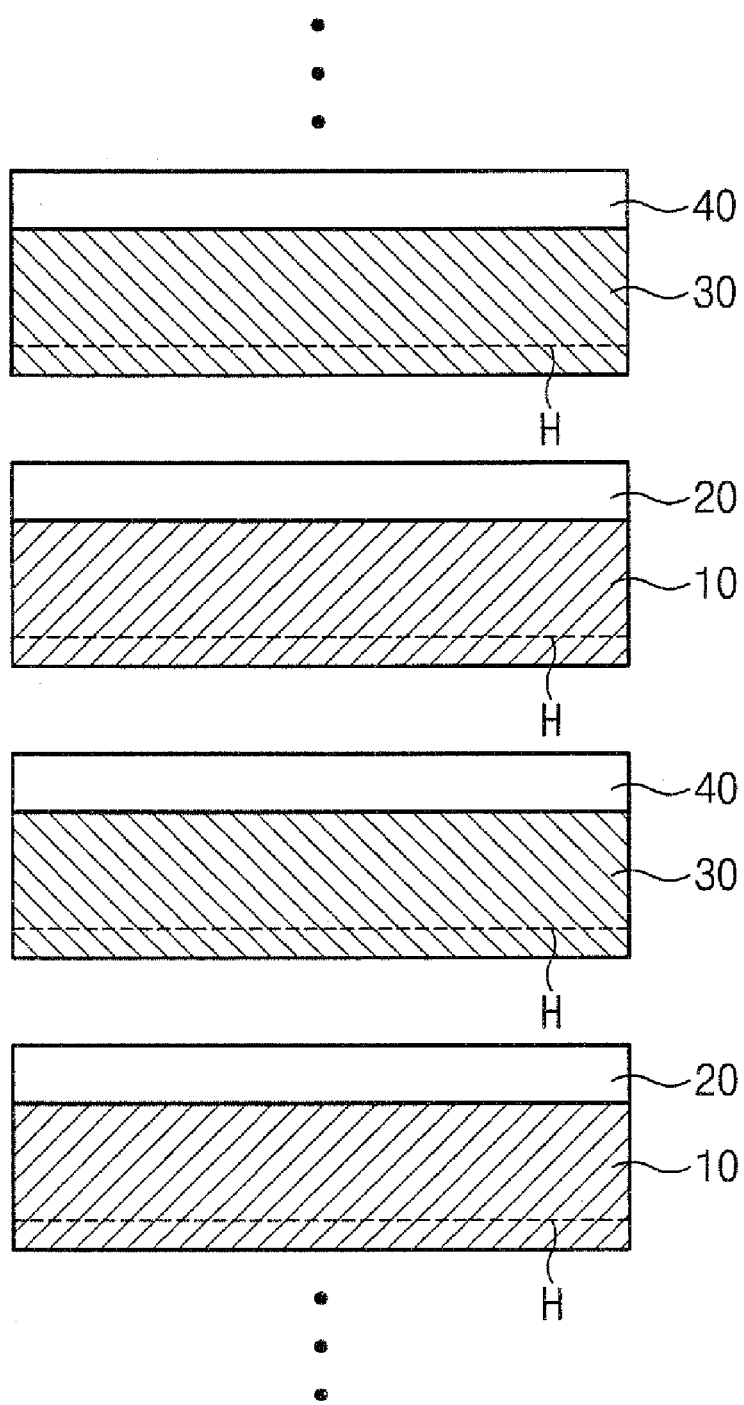
FIGS. 3 through 10 are cross-sectional views illustrating a method of forming a semiconductor device according to an embodiment of the present invention.

Referring to FIG. 3, first silicon substrates 10 and second silicon substrates 30 are provided. Each of the first and second silicon substrates 10 and 30 may be a single crystalline bulk silicon substrate cut from a single crystalline silicon ingot formed by, for example, a Czochralski growth method or a float zone growth method.

Top surfaces of the first and second silicon substrates 10 and 30 may have the equivalent crystal plane, or may have different crystal planes with respect to each other. For example, the top surface of each first silicon substrate 10 and the top surface of each second silicon substrate 30 may have the crystal plane {100} or the crystal plane {110}. Alternatively, the top surface of each first silicon substrate 10 may have the crystal plane {100}, and the top surface of each second silicon substrate 30 may have the crystal surface {110}.

The top surfaces of the first and second silicon substrates 10 and 30 may be arranged to have different crystal directions. For example, the first silicon substrate 10 and the second silicon substrate 30 may be arranged such that the crystal direction <110> of the top surface of the first silicon substrate 10, and the crystal direction <100> of the top surface of the second silicon substrate 30 are in substantially the same direction. These are merely examples of the present invention, and thus the scope of the present invention is not limited thereto.

Insulating layers 20 and 40 are formed on one set of surfaces of the first and second semiconductor substrates 10 and 30, respectively. According to some embodiments, the insulating layers 20 and 40 may be formed on both surfaces of the respective first and second semiconductor substrates 10 and 30. Thereafter, hydrogen ions are injected into the first and second semiconductor substrates 10 and 30 to form thin substrate isolation layers H. The substrate isolation layers H serve to facilitate cutting of the substrates.

Figure 4:
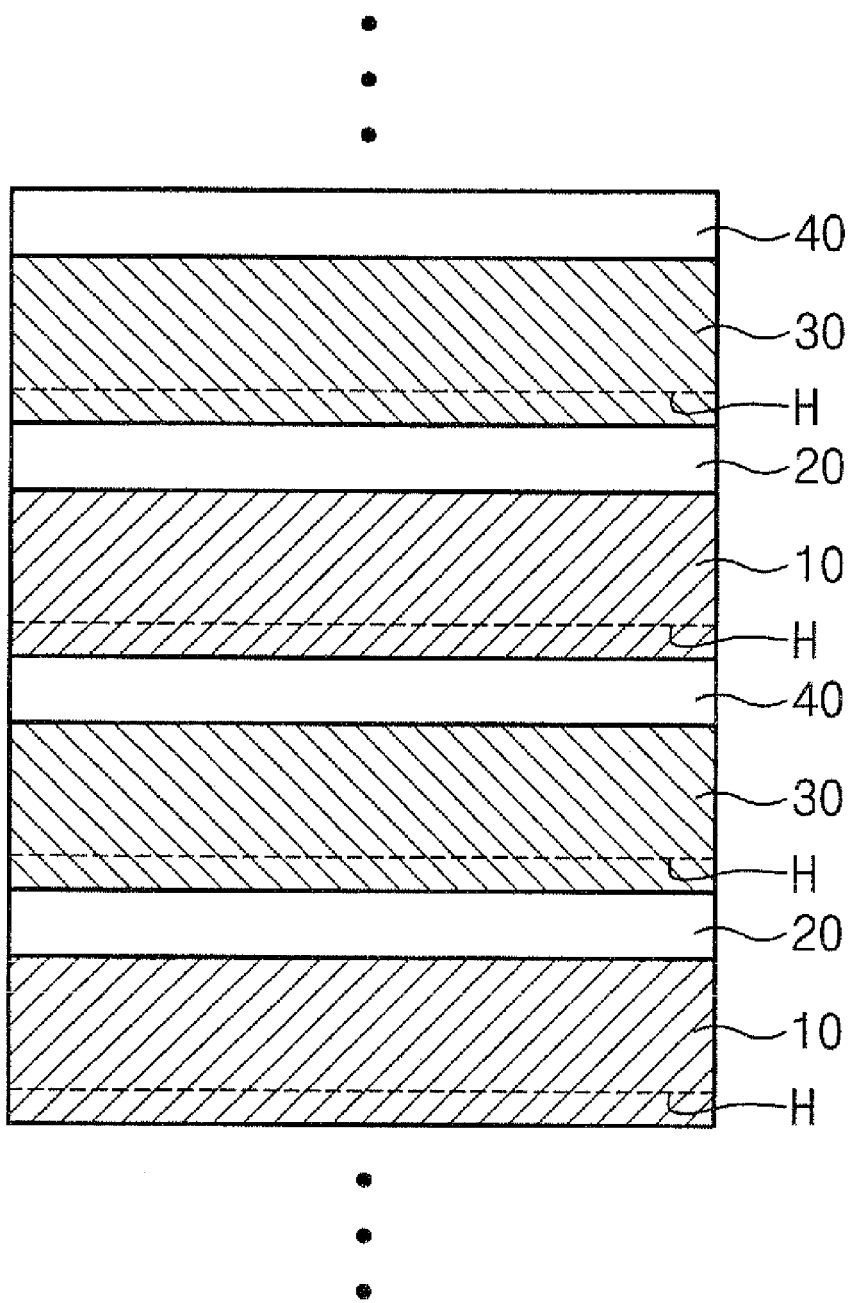

Referring to FIG. 4, the first semiconductor substrates 10 and the second semiconductor substrates 30 are alternately bonded together, with the insulating layers 20 and 40 that are alternately interposed between the first semiconductor substrates 10 and the second semiconductor substrates 30. The first semiconductor substrates 10 and the second semiconductor substrates 30 may be sequentially alternately coupled to each other. When the top surface of the first semiconductor substrate 10 and the top surface of the second semiconductor substrate 30 have the equivalent crystal plane {100}, for example, the first semiconductor substrate 10 may have the crystal direction <110> toward a flat zone, and the second semiconductor substrate 30 may have the crystal direction <100> toward a flat zone. The first semiconductor substrate 10 and the second semiconductor substrate 30 are bonded together, with their flat zones aligned with each other. Thus, even if having the equivalent crystal plane, the top surfaces of the first and second semiconductor substrates 10 and 30 may be arranged to have different crystal directions with respect to each other.

Figure 5:
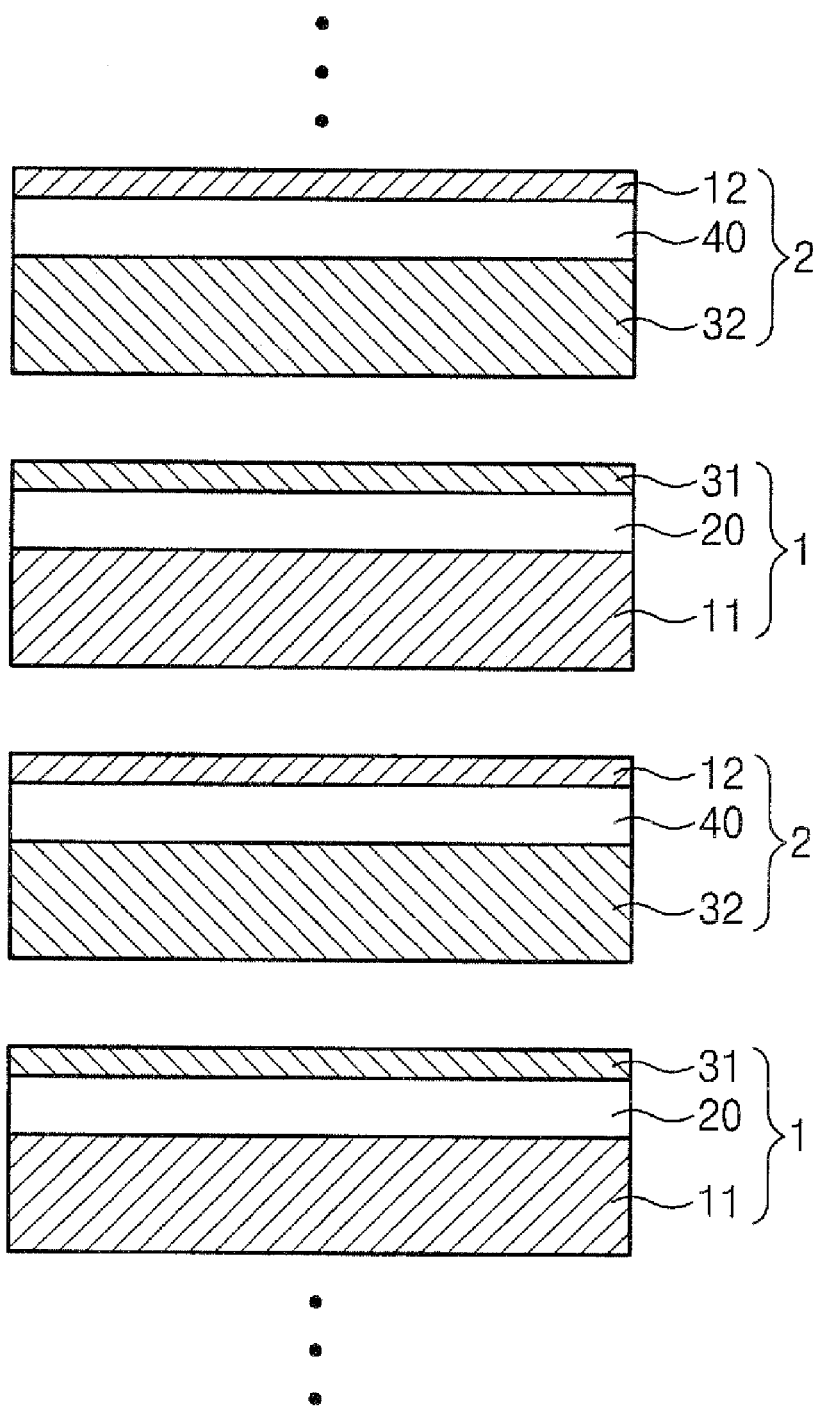

Referring to FIG. 5, the first semiconductor substrates 10 and the second semiconductor substrates 30 are cut to form first SOI substrates 1 and second SOI substrates 2, respectively. Each first SOI substrate 1 includes a first silicon layer 12, an insulating layer 20, and a second silicon layer 31. Each second SOI substrate 2 includes a first silicon layer 12, an insulating layer 40, and a second silicon layer 32. The first silicon layer 11 of the first SOI substrate 1 is used as a support substrate, and the second silicon layer 32 of the second SOI substrate 2 is used as a support substrate. An annealing process and a polishing process after cutting may be further performed. According to the present embodiment of the present invention, since both the first silicon substrate and the second silicon substrate are used to form SOI substrates, a waste of material, that is, silicon, can be prevented.

The first SOI substrate 1 or the second SOI substrate 2 may be used to form semiconductor devices according to some embodiments of the present invention. Hereinafter, a method of forming a semiconductor device using the first SOI substrate 1 will be described. However, one of ordinary skill in the art will appreciate that a similar method could be used to form a semiconductor device using the second SOI substrate 2. The first silicon layer 11 and the second silicon layer 31 may be arranged such that the crystal direction, for example, <110> of a top surface of the first silicon layer 11 of the first SOI substrate 1, and the crystal direction, for example, <100> of a top surface of the second silicon layer 31 are in substantially the same direction In other words, the top surfaces of the first and second silicon substrates 10 and 30 may be arranged to have different crystal directions.

Figure 6:
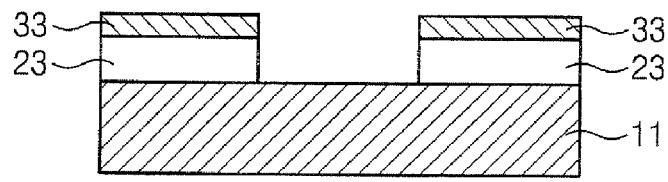

Referring to FIG. 6, the second silicon layer 31 and the insulating layer 20 are patterned to form a second silicon pattern 33 and patterned insulating layers 23. A dry-etching method may be used for the patterning. The first silicon layer 11 is exposed between the patterned insulating layers 23.

Figure 7:
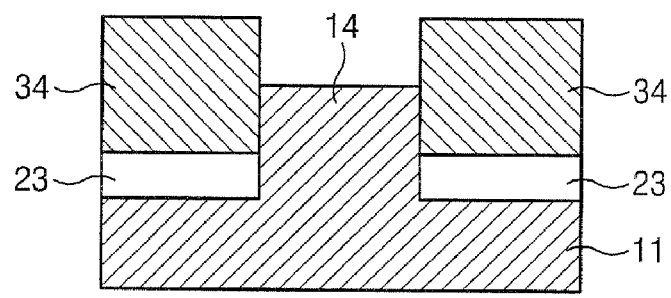
Figure 8:
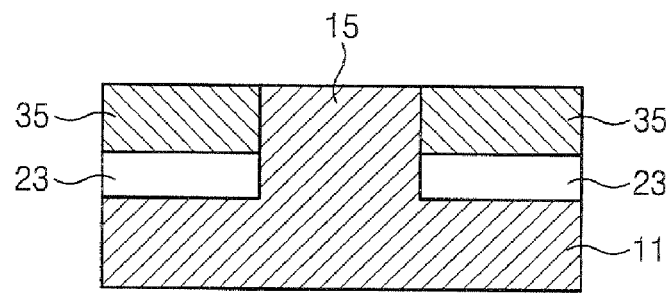
Figure 9:
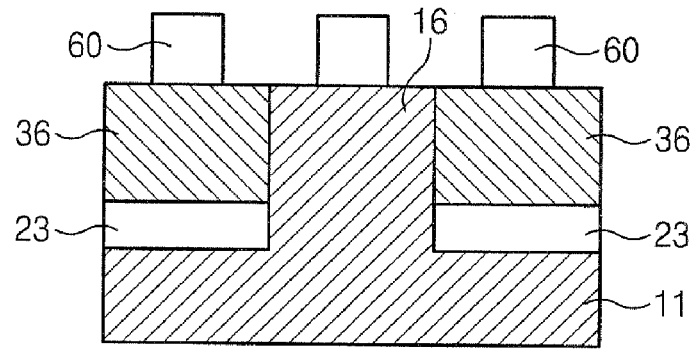

Referring to FIGS. 7 through 9, a first epitaxial layer 14 is epitaxially grown from the silicon layer 11, and a second epitaxial layer 34 is epitaxially grown from the second silicon pattern 33. A polishing process is performed to form a first epitaxial layer 15 and a second epitaxial layer 35 having top surfaces at substantially the same height. In other words, the top surfaces of the first epitaxial layer 15 and the second epitaxial layer 35 may be substantially flush with each other. A plurality of epitaxial processes and polishing processes may be repetitively performed to form a first epitaxial layer 16 and a second epitaxial layer 36. The polishing process may include, for example, a chemical mechanical polishing (CMP) process.

Since the first epitaxial layer 16 is grown in the crystal direction of the first silicon layer 11, and the second epitaxial layer 36 is grown in the crystal direction of the second silicon layer 31, the crystal direction <110> of a top surface of the first epitaxial layer 16 and the crystal direction <100> of a top surface of the second epitaxial layer 36 may be arranged in substantially the same direction.

Referring again to FIG. 9, a mask pattern 60 is formed on the first and second epitaxial layers 16 and 36. The mask pattern 60 may be formed of a material with etch selectivity with respect to the first and second epitaxial layers 16 and 36.

Figure 10:
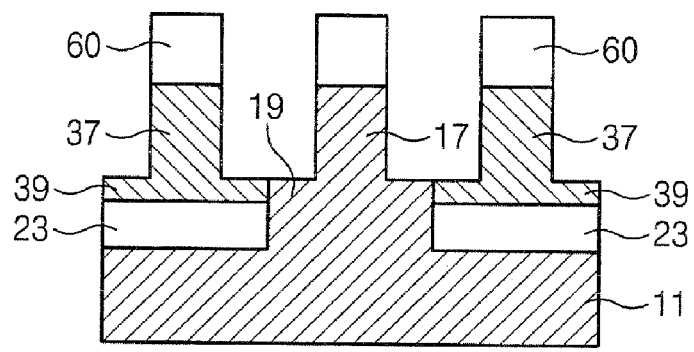

Referring to FIG. 10, an etching process, using the mask pattern 60 as an etch mask, is performed to form first and second silicon fins 17 and 37. That is, the first epitaxial layer 16 is patterned to form the first silicon fin 17, and the second epitaxial layer 36 is patterned to form the second silicon fin 37. After the first and second epitaxial layers 16 and 36 are etched, portions of the first and second epitaxial layers 16 and 36 are left between the first silicon fin 17 and the second silicon fin 37. The respective portions 19 and 39 of the first and second epitaxial layers 16 and 36 that are left after the etching may constitute an inter-fin connection member 50 as illustrated in FIG. 1. In the etching process, a dry etching method may be used.

The crystal direction <110> of the top surface of the first silicon fin 17 and the crystal direction <100> of the top surface of the second silicon fin 37 may be in substantially the same direction. As described above, the mobility of holes is greater in the crystal direction <100> than in the crystal direction <110>, and the mobility of electrons is greater in the crystal direction <110> than in the crystal direction <100>. Thus, an NMOS transistor (not shown) may be formed at the first silicon fin 17 to make a channel direction identical to the crystal direction <100>, and a PMOS transistor (not shown) may be formed at the second silicon fin 37 to make a channel direction identical to the crystal direction <110>. Thus, the NMOS and PMOS transistors can obtain improved operational characteristics.

Figure 11:
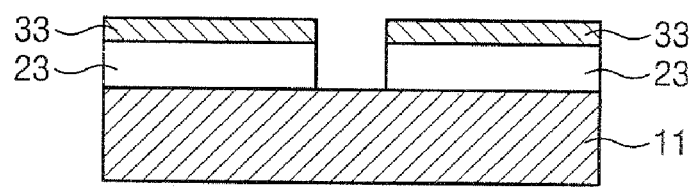
FIGS. 11 through 13 are cross-sectional views illustrating a method of forming a semiconductor device according to another embodiment of the present invention.
Figure 13:
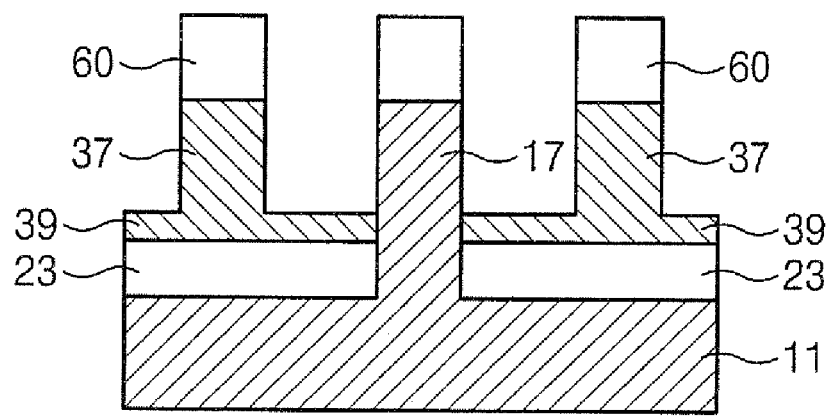

FIGS. 11 and 13 are cross-sectional views illustrating a method of forming a semiconductor device according to another embodiment of the present invention.

Portions explained above with reference to FIGS. 3 through 5 in the above embodiment may be applied in the same manner in the present embodiment. A method of forming a semiconductor device using the first SOI substrate 1 as an example will now be described. However, one of ordinary skill in the art will appreciate that a similar method could be used to form a semiconductor device using the second SOI substrate 2.

Referring to FIG. 11, the second silicon layer 31 and the insulating layer 20 are patterned to form a second silicon pattern 33 and patterned insulating layers 23. A dry-etching method may be used for the patterning. The first silicon layer 11 is exposed between the patterned insulating layers 23. In the present embodiment, an interval between the patterned insulating layers 23 is smaller than that of the above embodiment.

Figure 12:
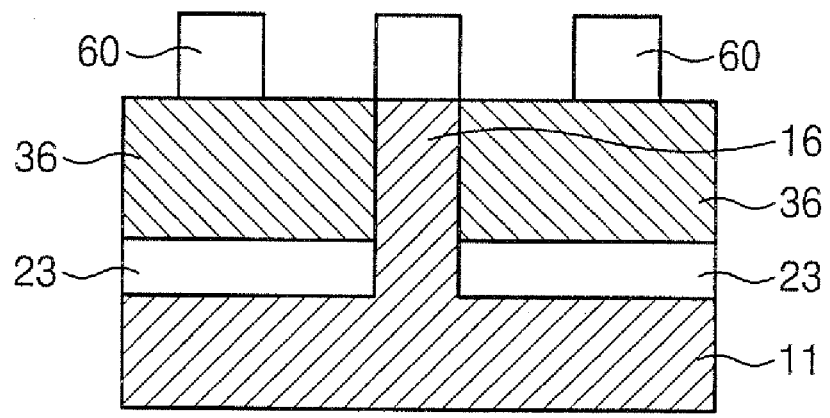

Referring to FIG. 12, a first epitaxial layer 16 is epitaxially grown from the silicon layer 11, and a second epitaxial layer 36 is epitaxially grown from the second silicon pattern 33. Like the above-mentioned embodiment, the first epitaxial layer 16 and the second epitaxial layer 36 may be formed by performing an epitaxial process and a polishing process repetitively. The polishing process may include a chemical mechanical polishing process. The crystal direction <110> of a top surface of the first epitaxial layer 16 and the crystal direction <100> of a top surface of the second epitaxial layer 36 may be in substantially the same direction.

A mask pattern 60 is formed on the first and second epitaxial layers 16 and 36. A width of the mask pattern 60 may be substantially the same as that of the first epitaxial layer 16. The mask pattern 60 may be formed of a material with etch selectivity with respect to the second epitaxial layer 36.

Referring to FIG. 13, an etch process, using the mask pattern 60 as an etch mask, is performed to form first and second silicon fins 17 and 37. That is, the first epitaxial layer 16 may serve as a first silicon fin 17 by itself, and the second epitaxial layer 36 is patterned to form a second silicon fin 37. After the second epitaxial layer 36 is etched, a portion of the second epitaxial layer 36 is left between the first silicon fin 17 and the second silicon fin 37. The portion 39 of the second epitaxial layer 36 that is left after the etching may form an inter-fin connection member 50 as illustrated in FIG. 2. In the etching process, a dry-etching method may be used. The crystal direction <110> of the top surface of the first silicon fin 17 and the crystal direction <100> of the top surface of the second silicon fin 37 may be in the same direction. An NMOS transistor (not shown) may be formed at the first silicon fin 17 to make a channel direction in the crystal direction <100>, and a PMOS transistor (not shown) may be formed at the second silicon fin 37 to make a channel direction in the crystal direction <110>. Accordingly, the NMOS and PMOS transistors with improved operational characteristics can be provided.

According to some embodiments of the present invention, the inter-fin connection member releases heat generated by a device operation, so that operational characteristics of the device can be improved.

According to some embodiments of the present invention, optimum NMOS and PMOS transistors may be formed on a substrate.

According to some embodiments of the present invention, an SOI substrate of a semiconductor material can be formed without a waste of the semiconductor material.

According to some embodiments of the present invention, the semiconductor device comprises a semiconductor layer; a first semiconductor fin and a second semiconductor fin disposed on the semiconductor layer and having different crystal directions; an insulating layer interposed between the second semiconductor fin and the semiconductor layer, and having an opening in which the first semiconductor fin is inserted; and an inter-fin connection member connecting the first semiconductor fin and the second semiconductor fin to each other on the insulating layer. The first semiconductor fin is connected to the semiconductor layer, and has the equivalent crystal direction as that of the semiconductor layer.

In one embodiment, the first semiconductor fin may be epitaxially grown from the semiconductor layer. One of the first and second semiconductor fins may have a top surface with a crystal direction <100>, and the other fin may have a top surface with a crystal direction <110>. The inter-fin connection member may include a material having the equivalent crystal plane and the equivalent crystal direction as those of the second semiconductor fin.

In another embodiment, the opening may have a width that is equal to or greater than a width of the first semiconductor fin.

In still another embodiment, a PMOS transistor may be disposed at one of the first and second semiconductor fins, and an NMOS transistor may be disposed at the other.

According to embodiments of the present invention, the method of forming a semiconductor device comprises providing a substrate including a first semiconductor layer, a second semiconductor layer on the first semiconductor layer, and an insulating layer interposed therebetween, the first semiconductor layer and the second semiconductor layer having different crystal directions; patterning the second semiconductor layer and the insulating layer to form a second semiconductor pattern exposing the first semiconductor layer; forming a first epitaxial layer and a second epitaxial layer that are epitaxially grown from the exposed first semiconductor layer and the semiconductor pattern, respectively; and patterning the first epitaxial layer and the second epitaxial layer to form a first semiconductor fin and a second semiconductor fin, respectively. Forming the first semiconductor fin and the second semiconductor fin comprises forming an inter-fin connection member that connects the first semiconductor fin with the second semiconductor fin.

In one embodiment, providing the substrate includes providing a first semiconductor substrate and a second semiconductor substrate. An insulating layer is formed on one surface of each of the first and second semiconductor substrates. The first and second semiconductor substrates are bonded together, with the insulating layer interposed therebetween, such that the equivalent crystal directions of a top surface of the first semiconductor substrate and a top surface of the second semiconductor substrate faces different directions.

In another embodiment, bonding the first and second semiconductor substrates may include sequentially alternately stacking the first and second semiconductor substrates. The top surface of the first semiconductor substrate and the top surface of the second semiconductor substrate may have different crystal planes. Alternately, in the bonding of the first and second semiconductor substrates, the top surface of the first semiconductor substrate and the top surface of the second semiconductor substrate may have the equivalent crystal plane, and the first semiconductor substrate and the second semiconductor substrate may be arranged such that a crystal direction <110> of the top surface of the first semiconductor substrate and a crystal direction <100> of the top surface of the second semiconductor substrate are in substantially the same direction.

In another embodiment, top surfaces of the first and second epitaxial layers may be at the same height. The inter-fin connection member may be formed by leaving portions of the first and second epitaxial layer between the first semiconductor fin and the second semiconductor fin during the patterning of the first and second epitaxial layers.

In another embodiment, a PMOS transistor may be formed at one of the first semiconductor fin and the second semiconductor fin, and an NMOS transistor may be formed at the other. The NMOS transistor may be formed with a channel direction in a crystal direction <100>, and the PMOS transistor may be formed with a channel direction in a crystal direction <110>.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
a semiconductor layer;

a first semiconductor fin and a second semiconductor fin disposed on the semiconductor layer and having different crystal directions with respect to each other;

an insulating layer interposed between the second semiconductor fin and the semiconductor layer, the insulating layer defining an opening in which the first semiconductor fin is disposed; and an inter-fin connection member on the insulating layer, the inter-fin connection member connecting the first semiconductor fin and the second semiconductor fin to each other, wherein the first semiconductor fin is connected to the semiconductor layer, and has an equivalent crystal direction that is the same as that of the semiconductor layer, wherein the inter-fin connection member comprises a material that is the same as at least one of the first semiconductor fin and the second semiconductor fin.

2. The semiconductor device of claim 1, wherein the first semiconductor fin is epitaxially grown from the semiconductor layer.

3. The semiconductor device of claim 1, wherein one of the first and second semiconductor fins has a top surface with a crystal direction <100>, and the other of the first and second semiconductor fins has a top surface with a crystal direction <110>.

4. The semiconductor device of claim 1, wherein the inter-fin connection member includes a material that has the equivalent crystal plane and the equivalent crystal direction as the second semiconductor fin.

5. The semiconductor device of claim 1, wherein the opening has a width substantially equal to a width of the first semiconductor fin.

6. The semiconductor device of claim 1, wherein a PMOS transistor is disposed at one of the first and second semiconductor fins, and an NMOS transistor is disposed at the other of the first and second semiconductor fins.

7. The semiconductor device of claim 1, wherein the opening has a width greater than a width of the first semiconductor fin.

8. The semiconductor device of claim 1, wherein top surfaces of the first and second semiconductor fins have the equivalent crystal planes.

9. The semiconductor device of claim 1, wherein the inter-fin connection member is configured to release heat generated from the second semiconductor fin to the semiconductor layer connected to the first semiconductor fin.

* * * * *

UNITED STATES PATENT AND TRADEMARK OFFICE
CERTIFICATE OF CORRECTION

PATENT NO. : 7,573,123 B2  
APPLICATION NO. : 11/775130  
DATED : August 11, 2009  
INVENTOR(S) : David Nhu Page 1 of 1

It is certified that error appears in the above-identified patent and that said Letters Patent is hereby corrected as shown below:

Column 3, line 10, the word "arc" should read -- are --;  
Column 3, line 50, the word "tin" should read -- fin --.

Signed and Sealed this

Twenty-second Day of December, 2009

David J. Kappos  
*Director of the United States Patent and Trademark Office*